United States Patent
Hess et al.

(10) Patent No.: US 7,750,465 B2
(45) Date of Patent: Jul. 6, 2010

(54) PACKAGED INTEGRATED CIRCUIT

(75) Inventors: Kevin J. Hess, St. Ismier (FR); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 468 days.

(21) Appl. No.: 11/680,177

(22) Filed: Feb. 28, 2007

(65) Prior Publication Data
US 2008/0203588 A1 Aug. 28, 2008

(51) Int. Cl.
*H01L 21/67* (2006.01)
*H01L 23/31* (2006.01)

(52) U.S. Cl. .............. 257/724; 257/684; 257/730; 257/784; 257/786; 257/787; 257/E21.502; 257/E23.124; 257/E23.125

(58) Field of Classification Search ............... 257/659, 257/E23.033, E23.052, E23.114, E23.124
See application file for complete search history.

(56) References Cited

U.S. PATENT DOCUMENTS

| | | | |
|---|---|---|---|
| 5,362,679 A | 11/1994 | Wakefield | |
| 5,744,827 A | 4/1998 | Jeong et al. | |
| 5,869,905 A | 2/1999 | Takebe | |
| 6,222,259 B1 | 4/2001 | Park et al. | |
| 6,294,830 B1 * | 9/2001 | Fjelstad | 257/724 |
| 6,369,454 B1 | 4/2002 | Chung | |
| 6,903,465 B2 | 6/2005 | Farnworth et al. | |
| 7,026,709 B2 | 4/2006 | Tsai et al. | |
| 7,548,430 B1 * | 6/2009 | Huemoeller et al. | 361/760 |
| 2005/0067676 A1 | 3/2005 | Mahadevan et al. | |

* cited by examiner

*Primary Examiner*—Zandra Smith
*Assistant Examiner*—Tsz K Chiu
(74) *Attorney, Agent, or Firm*—James L. Clingan, Jr.; David G. Dolezal

(57) ABSTRACT

A packaged integrated circuit has an integrated circuit over a support structure. A plurality of bond wires connected between active terminals of the integrated circuit and the support structure. An encapsulant overlies the support structure, the integrated circuit, and the bond wires. The encapsulant has a first open location in the encapsulant so that a first bond wire is exposed and a second open location in the encapsulant so that a second bond wire is exposed. First and second conductive structures are exposed outside the packaged integrated circuit and are located at the first and second open locations, respectively, and electrically connected to the first and second bond wires, respectively.

15 Claims, 7 Drawing Sheets

PACKAGED INTEGRATED CIRCUIT

BACKGROUND

1. Field

This disclosure relates generally to integrated circuits, and more specifically, to a packaged integrated circuit

2. Related Art

One of the techniques that has been used for increasing the density of circuits on a printed circuit board is to stack the integrated circuits, which are also commonly called stacked die package. This is also desirable when two integrated circuits function closely together but are preferably made differently. One example is an rf integrated circuit that has rf functions and another integrated circuit in which information is coupled back and forth between them. The processes used for optimizing the logic device are different from the processes used in optimizing the rf device. One of the techniques for stacking has been to stack integrated circuits and couple them together by bumps or wire bonding. This can be effective, but a disadvantage is that often it is difficult to adequately test the integrated circuits prior to packaging sufficiently to ensure that they operate as required. Testing at the integrated circuit level prior to packaging when still part of a wafer, typically called wafer probe, is effective to an extent but generally does not allow for sufficient testing to ensure that the integrated circuit will be meet all of the performance requirements. Thus, when stacking integrated circuits, the complete testing is not done until after all of the die are stacked and packaging is complete. When this happens, if any one of the die are defective, the whole package is then defective. There may or may not be a possibility of rework to salvage the good die, but any such rework is likely to be expensive and time consuming as well as risk making the remaining good ones into defective ones. The package on package techniques tend to be limited in applicability to using die of the same size and function or having an excessively large base. They may even require further packaging.

Thus, there is a need for ability to provide integrated circuits with the ability to be interconnected that improve one or more of the existing difficulties.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a packaged integrated circuit is configured for convenient connections on the top side. One use of this is for stacking die, and another is for connecting with a flex substrate. The overlying connections are made to wire-bonded wires that are near the surface by forming grooves which may be achieved by cutting. The grooves are selectively filled at the locations where wire bonds are exposed to provide the convenient connection. This is better understood by reference to the drawings and the following description.

Figure 1:
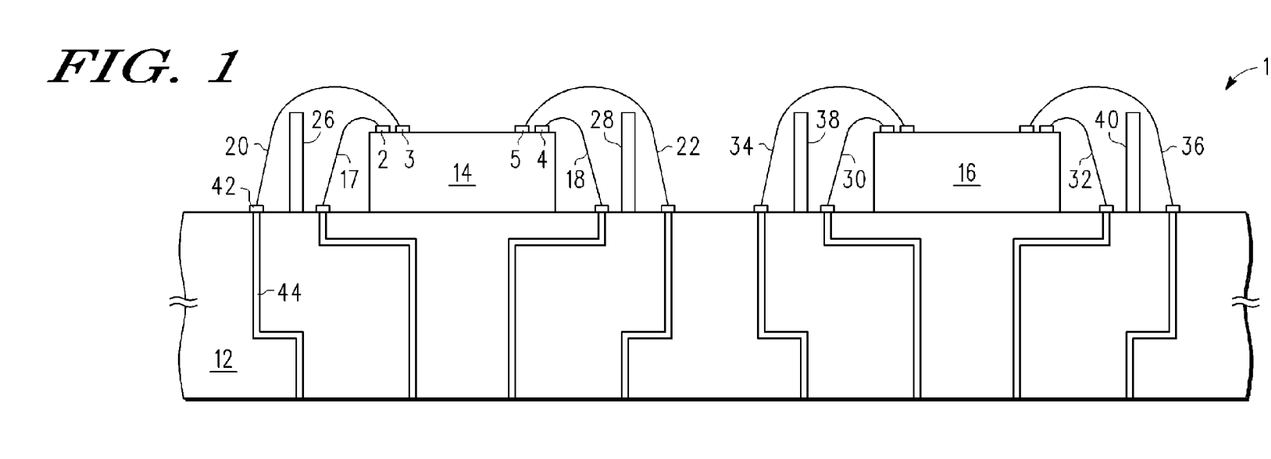
FIG. 1 is a cross section of a packaged integrated circuit according to one embodiment at a stage in processing.

Shown in FIG. 1 is a structure 10, which is a packaged integrated circuit, comprising a substrate 12; integrated circuits, also known as die, 14 and 16 on substrate 12; wires 17, 18, 20, 22, 30, 32, 34, and 36; support posts 26, 28, 38, and 40; bond pads such as bond pad 42; and vias such as via 44. Bond wires 17, 18, 20, 22, 30, 32, 34, and 36 are connected at one end to bond pads on substrate 12. For example wire 20 is connected to pad 42 which is connected to a via 44 which extends through substrate 12 to be exposed on the bottom side of substrate 12. The side of substrate 12 which has the integrated circuits on it is the top side. Wires 17 and 20 are connected to bond pads 2 and 3, respectively, of integrated circuit 14 on one side, and wires 18 and 22 are connected to bond pads 4 and 5, respectively of integrated circuit 14 on the other side. Wires 22 and 20 have a greater height than wire bonds 17 and 18. Similarly wires 30 and 34 are connected to integrated circuit 14 on one side, and wires 32 and 36 are connected to integrated circuit 14 on the other side. Wires 34 and 36 have a greater height than wire bonds 30 and 32. Support posts 26, 28, 38, and 40 extend from substrate 12 to height preferably a little above that of wires 17, 18, 30 and 32. Support posts 26, 28, 38, and 40 may be metal, such as copper, If substrate 12 is an insulator. These posts may be placed at the same time as integrated circuits 14 and 16 are attached by a die-attach process. The same die-attach process may be able to be used, especially if the support posts are of the same material as the backside of integrated circuits 14 and 16. Substrate 12 is preferably of the type used for ball grid arrays (BGAs), which is typically printed circuit board material, but could also be a metal, ceramic or other material. For example, if the package is intended to be a leaded package, preferably the substrate material would be metal. The shown example is for BGAs. Substrate 12 is preferably much thicker than integrated circuits 14 and 16. Wires 17, 20, 18, and 22 are connected to active terminals of integrated circuit 14 through bond pads 2, 3, 4, and 5. Active terminals are bonding sites for signals, power, or ground. Examples of signals are data signals, address signals, analog signals, and control signals. An example of power is VDD. In this example, at least one of wires 20 and 22 is a signal line connected to a signal terminal of integrated circuit 14.

Figure 2:
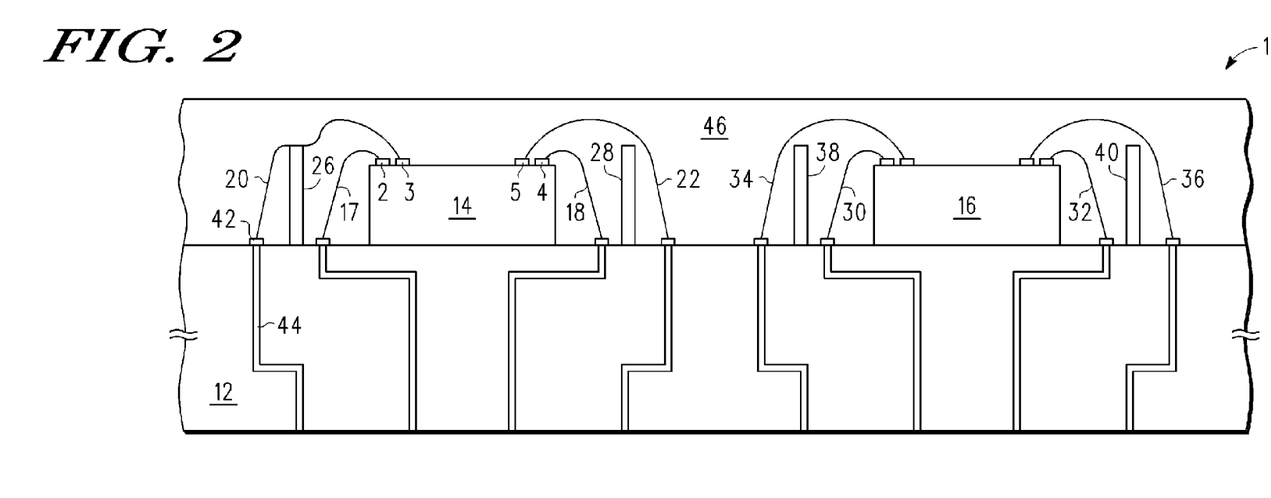
FIG. 2 is a cross section of the packaged integrated circuit of FIG. 1 at a subsequent stage in processing.

Shown in FIG. 2 is packaged integrated circuit structure 10 after forming an encapsulant 46 over integrated circuits 14 and 16 and wires 17, 18, 20, 22, 30, 32, 34, and 36. Encapsulant 46 is preferably epoxy resin which is typical for BGAs but could be another insulating material depending on the particular packaging needs. In this example wire 20 is pressed against support post 26. This type of movement of wires may occur during molding. Support post 26 is to ensure that wire 20 is at least a certain height above substrate 12. Similarly encapsulant 46 must not be thicker than a certain amount to ensure that wires 20, 22, 34, and 36 are no more than a certain distance from the top surface of encapsulant 46. Wires 22, and 34, and 36 are shown as not moving during the molding process. With sufficient care it should be possible to ensure that the wires be at least a sufficient distance from substrate 12 such that support posts 26, 28, 38, and 40 would not be needed. Thus, although shown, it is preferable that support posts 26, 28, 38, and 40 not be used but can be if necessary.

Figure 3:
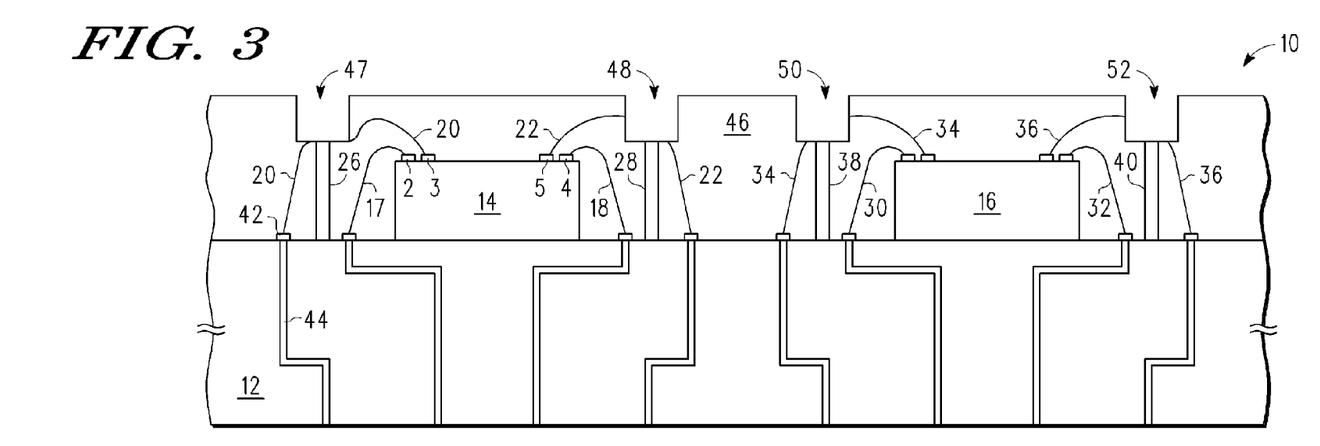
FIG. 3 is a cross section of the packaged integrated circuit of FIG. 2 at a subsequent stage in processing.

Shown in FIG. 3 is packaged integrated circuit structure 10 after forming grooves 47, 48, 50 and 52 in the top side of encapsulant 46. Grooves 47, 48, 50 and 52 are openings that sever wires 20, 22, 34, and 36, respectively, during the process of forming grooves 47, 48, 50 and 52. This has the affect of exposing wires 20, 22, 34, and 36. Grooves 47, 48, 50 and 52 are preferably about 100 microns in width and a depth of about 50 microns. Other dimensions may also be effective. The width could be 40 microns for example. Other aspect ratios may also be effective. While the formation of grooves is described, the affect of exposing the wires may also be accomplished by forming holes in the encapsulation to the depth of the wires. One tool that can be used for this is a diamond blade that is used for singulating wafers. Laser may also be used and, if it is available, is preferable to the diamond blade. A further alternative is a water jet.

Figure 4:
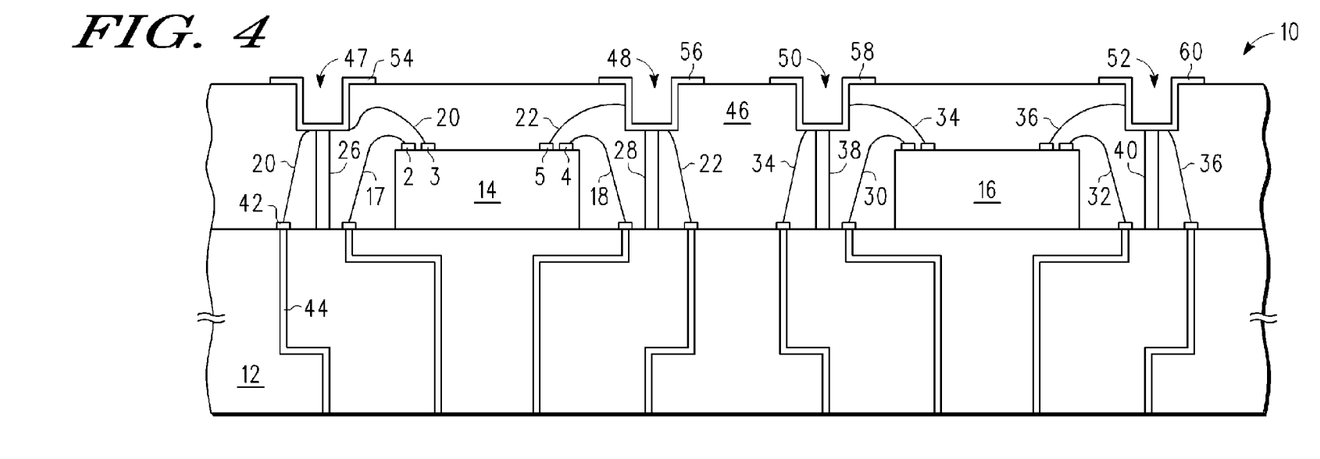
FIG. 4 is a cross section of the packaged integrated circuit of FIG. 3 at a subsequent stage in processing.

Shown in FIG. 4 is packaged integrated circuit structure 10 after forming conductive liners 54, 56, 58, and 60 in grooves 47, 48, 50, and 52. Liners 54, 56, 58, and 60 may be formed in the same manner as liners used in ball grid arrays, which is commonly referred to as UBM (under bump metallurgy). This has the affect of reconnecting the wires that were severed. Conductive liners 54, 56, 58, and 60 are formed using a patterned etch. The grooves have conductive liners at locations along the groove where wires are severed.

Figure 5:
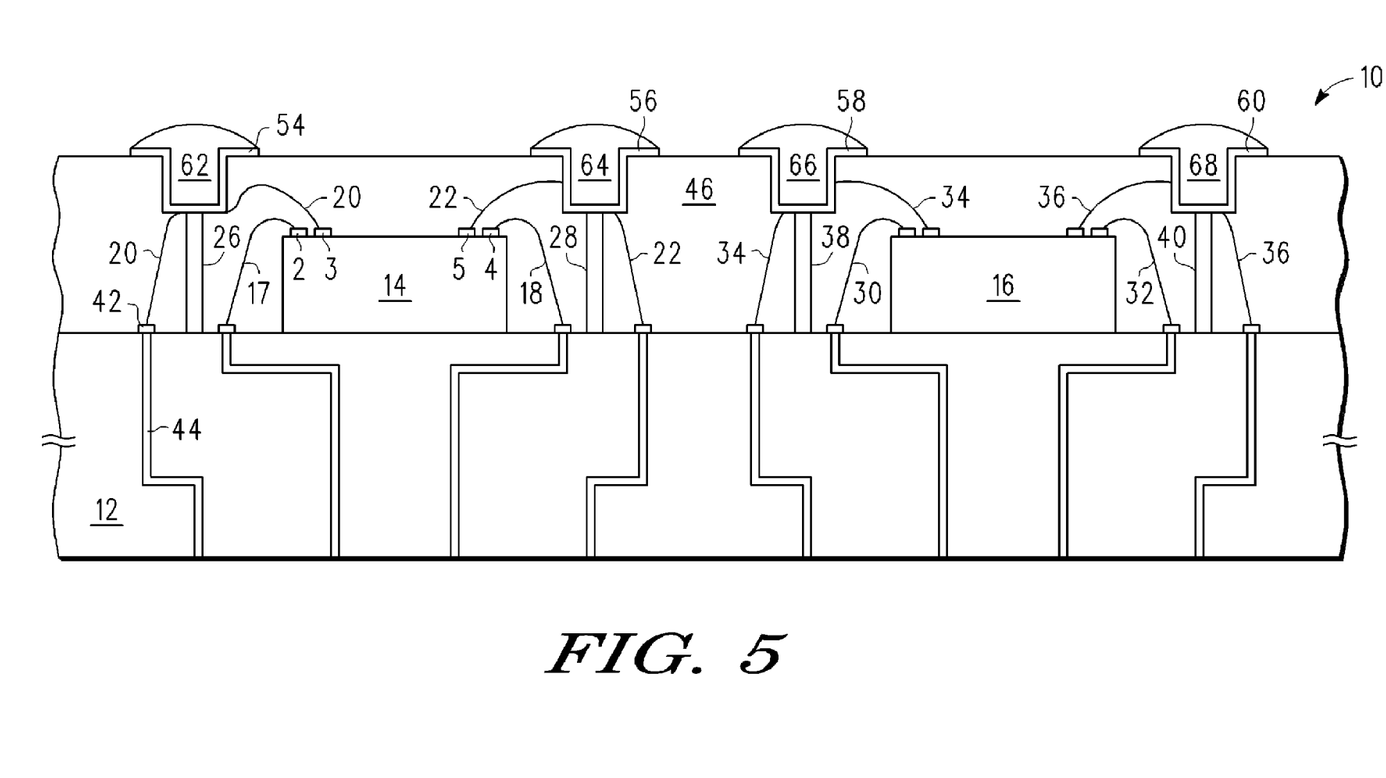
FIG. 5 is a cross section of the packaged integrated circuit of FIG. 4 at a subsequent stage in processing.

Shown in FIG. 5 is packaged integrated circuit structure 10 after filling grooves 47, 48, 50, and 52 with conductive fills 62, 64, 66, and 68. Conductive fills 62, 64, 66, and 68 may be a conductive polymer such as epoxy with silver filler. Other conductive materials may also be effective. This has the further affect of providing a better connection where the wires were severed as well providing for a connection external to is packaged integrated circuit structure 10. A conductive structure is formed in the grooves for making it convenient to make electrical contact on the top side. The conductive structure in this case is then the conductive fills plus conductive liners but it may be feasible to have a simpler conductive structure not requiring both elements. The conductive ink or polymer used to form conductive fills may also be used to form electrical connections between grooves by forming conductive traces of wires on the top surface of the package.

Figure 6:
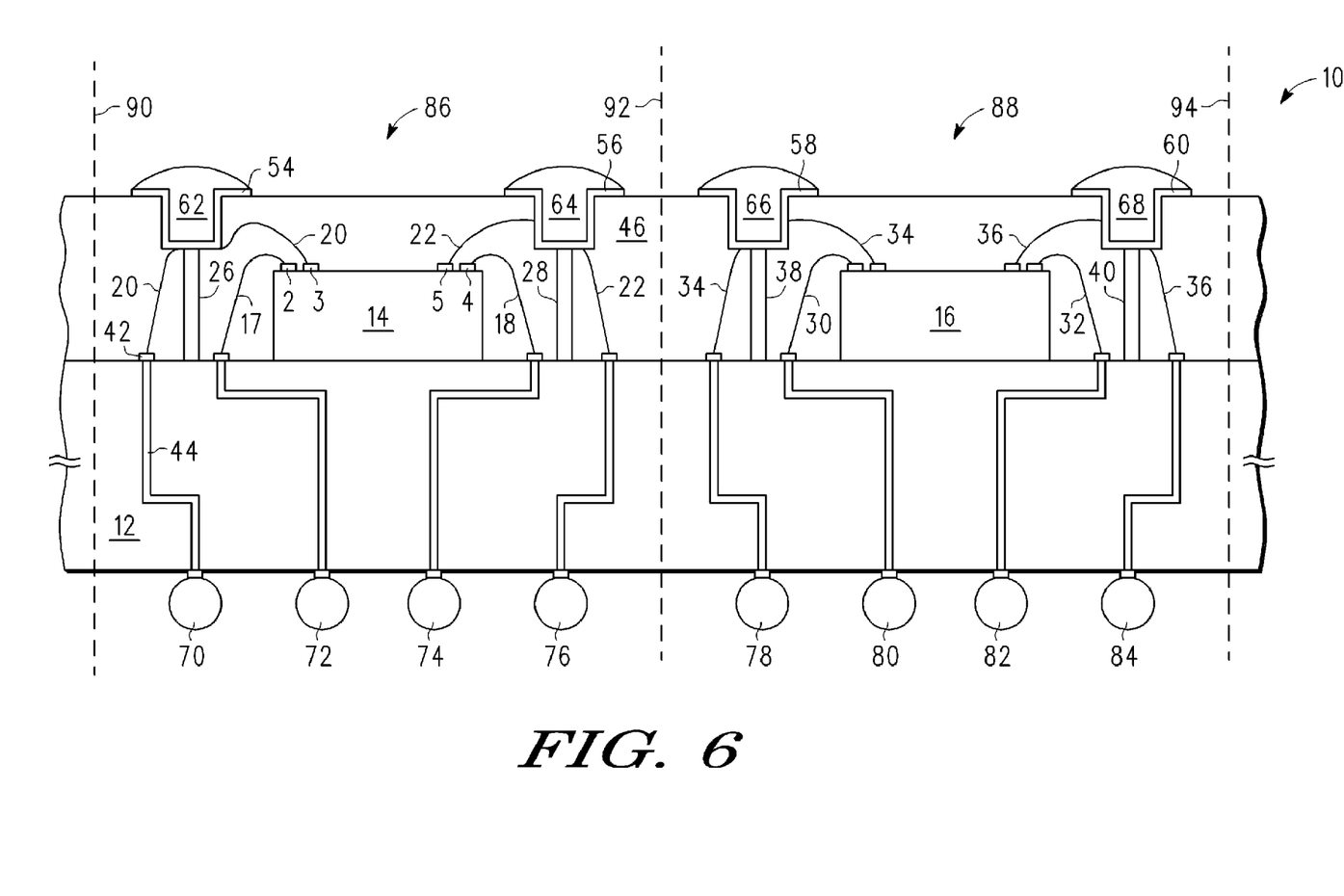
FIG. 6 is a cross section of the packaged integrated circuit of FIG. 5 at a subsequent stage in processing.

Shown in FIG. 6 is packaged integrated circuit structure 10 after forming solder balls 70, 72, 74, 76, 78, 80, 82, and 84 attached to the vias. Solder ball 70, for example, is coupled to via 44. This may be performed by a conventional BGA process or some other process. Such a process would normally have a liner formed using UBM between the balls and the vias. Also shown in FIG. 6 are singulation lines 90, 92, and 94 running vertically and separating packaged integrated circuit structure 10 into a packaged integrated circuit 86 between singulation lines 90 and 92 and packaged integrated circuit 88 between singulation lines 92 and 94. In FIG. 6 only four solder balls 70, 72, 74, and 76 and two conductive fills 54 and 56 are shown for packaged integrated circuit 86 but many more would be present.

Packaged integrated circuits 86 and 88 are thus ready, after completing singulation, for complete testing and then for stacking with other integrated circuits or for having some other contact external to integrated circuits 86 and 88 to conductive fills 62, 64, 66, and 68. In this case all of the connections to integrated circuit 14 on the top side through conductive fills 62 and 64 are also available on the bottom side of packaged integrated circuit 86 through solder balls 70 and 76. Thus complete testing of packaged integrated circuit 86 on the bottom side is possible.

Figure 7:
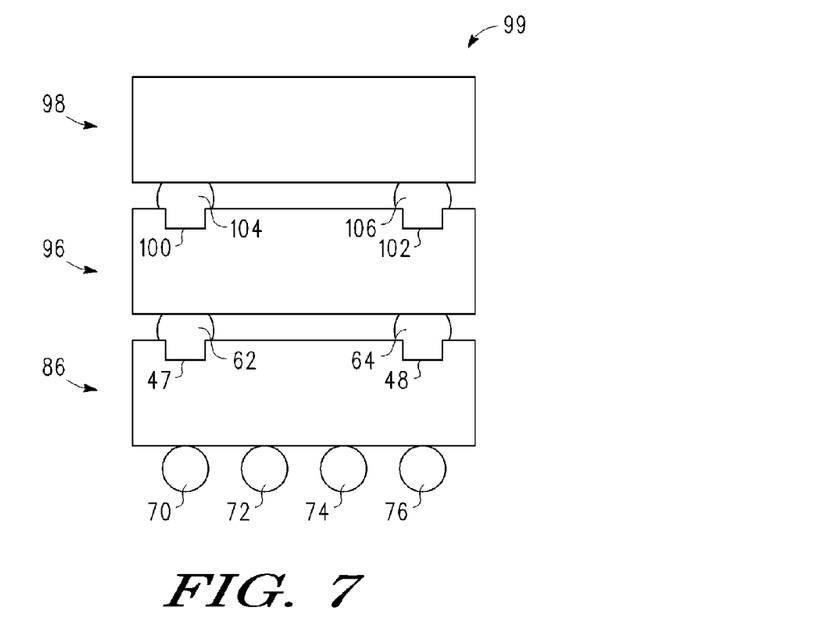
FIG. 7 depicts a first multiple packaged integrated circuit arrangement using the packaged integrated circuit of FIG. 6.

Shown in FIG. 7 is stacked structure 99 comprising packaged integrated circuit 86, packaged integrated circuit 96 on packaged integrated circuit 86, and a packaged integrated circuit 98 on packaged integrated circuit 96. Packaged integrated circuit 96 has grooves 100 and 102 filled with conductive fills 104 and 106 of the same type as conductive fills 62 and 64. The bottom side of packaged integrated circuit 96 has connections aligned to conductive fills 62 and 64 for making contact. The bottom side connections can be directly to vias or pads connected to vias. Also the bottom side of integrated circuit 96 may have solder balls for connecting to conductive fills 62 and 64. Packaged integrated circuits 96 and 98 may be the same function or a different function than that of packaged integrated circuit 86. As indicated earlier, in this cross section only two active terminals are shown for packaged integrated circuit 86 on the top side but more are present.

Figure 8:
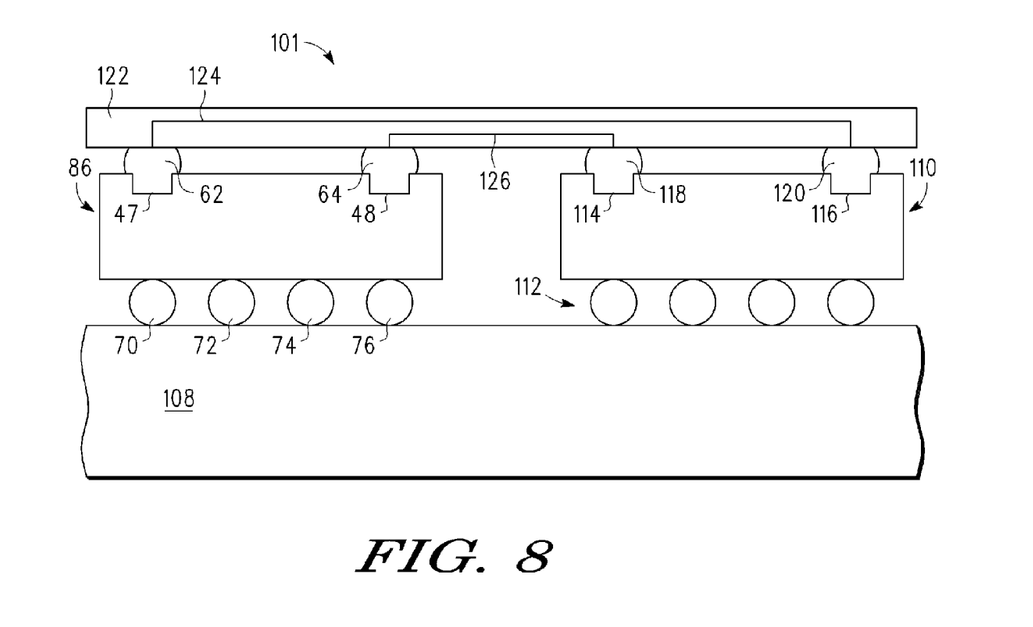
FIG. 8 depicts a second multiple packaged integrate circuit arrangement using the packaged integrated circuit of FIG. 6.

Shown in FIG. 8 is a lateral structure 101 using packaged integrated circuit 86 in combination with another packaged integrated circuit 110. Packaged integrated circuit 110 is packaged in the same manner as packaged integrated circuit 86 and may have either the same type or a different type of integrated circuit inside. Both packaged integrated circuits 86 and 110 have their solder balls on the bottom side connected to a printed circuit board 108 and their top sides connected through a flexible tape wiring 122. One type of flexible tape wiring comprises patterned copper traces over a polyimide tape with a solder mask over the patterned copper traces. The solder mask has openings to the wires so that connections can be made using solder balls, for example. Flexible tape wiring 122 has a wire 124 connected to conductive fill 62 and a conductive fill 120 on the top side of packaged integrated circuit 110. Flexible tape wiring 122 also has a wire 126 connected to conductive fill 64 and a conductive fill 118 of packaged integrated circuit 110. This shows that two integrated circuits can be connected to a printed circuit while also being connected to each other by flexible tape wiring rather than having to be interconnected exclusively through the printed circuit board.

Figure 9:
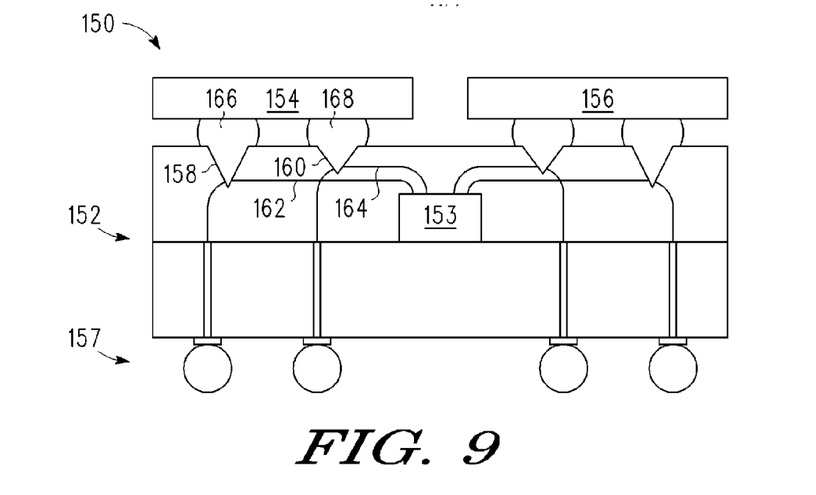
FIG. 9 depicts a third multiple packaged integrated circuit arrangement.

Shown in FIG. 9 is a multi-package structure 150 comprising a packaged integrated circuit 152, a packaged integrated circuit 154, and a packaged integrated circuit 156 all packaged in substantially the same manner as packaged integrated circuit 86. Packaged integrated circuit 152 is shown in more detail and shows having grooves, such as grooves 158 and 160, which are V-shaped instead of the rectangular shape shown for packaged integrated circuit 86. Packaged integrated circuit 86 is shown with rectangular grooves, but could also be made with V-shaped grooves or some other shape as desired to fit the particular needs of the situation and the capabilities that are available in the situation. In this case there are two packaged integrated circuits 154 and 156 over another packaged integrated circuit 152. Packaged integrated circuit 152 has an integrated circuit 153 with two grooves 158 and 160 on one side and two grooves on the other side. Packaged integrated circuit 152 has a wire 162 connected to an active terminal of integrated circuit 153 and to a via on a substrate and a wire 164, higher than wire 162, connected to an active terminal of integrated circuit 153 and a via on the substrate. This shows wires of differing heights being cut with grooves of different depths. Thus the formation of groove 160 does not cut wire 162. The deeper groove 166 cuts wire 158 but is further away from integrated circuit 153 than the termination of wire 164 so wire 164 is not cut by groove 158. Wires 164 and 162 appear to cross in FIG. 9 but they do not touch because they are staggered in relation to each other. This shows that it is possible to have multiple rows of grooves on the same side of the integrated circuit and that multiple packaged integrated circuits may be on the same packaged integrated circuit. A plurality of solder balls 157 are attached to the bottom of packaged integrated circuit 152 and electrically coupled to integrated circuit 153 and packaged integrated circuits 154 and 156.

Figure 10:
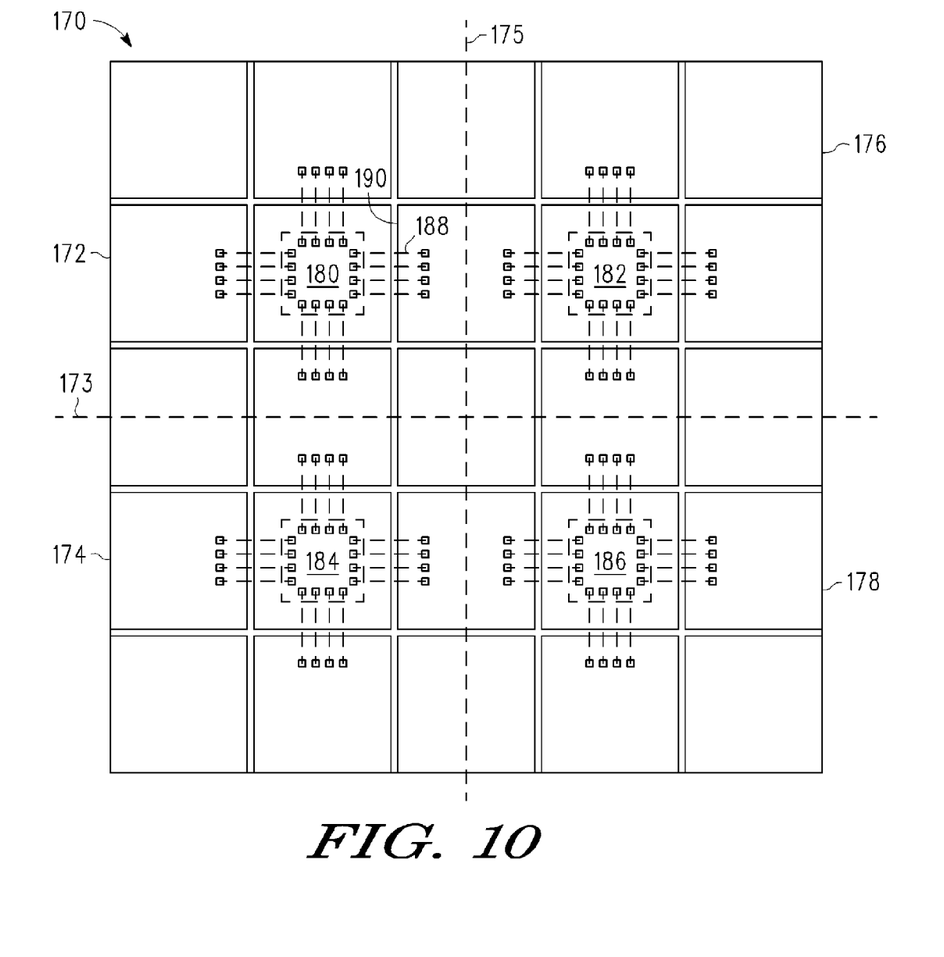
FIG. 10 is a top view of a matrix substrate of packaged integrated circuits prior to singulation.

Shown in FIG. 10 is a matrix 170 comprising packaged integrated circuits 172, 174, 176, and 178 whose borders are defined by scribe lines 173 and 175. Packaged integrated circuits 172, 174, 176, and 178 are formed in the same manner as packaged integrated circuit 86 and 88 prior to forming the conductive liners. Packaged integrated circuits 172, 174, 176, and 178 have integrated circuits 180, 184, 182, and 186, respectively. Integrated circuits 180, 184, 182, and 186, the wires connected to them, and the bonding locations are shown in dotted lines because they are below the top surface of the package. Grooves are shown on all four sides of each of integrated circuits 180, 184, 182, and 186 and cutting wires extending across the grooves. An exemplary wire is wire 188 connecting to integrated circuit 180. An exemplary groove is groove 190 that cuts wires that are connected to integrated circuits 180 and 184. In particular, groove 190 cuts wire 188. This shows that grooves can be on all sides of the integrated circuits as well showing the multiple wires that are cut by a single groove.

Figure 11:
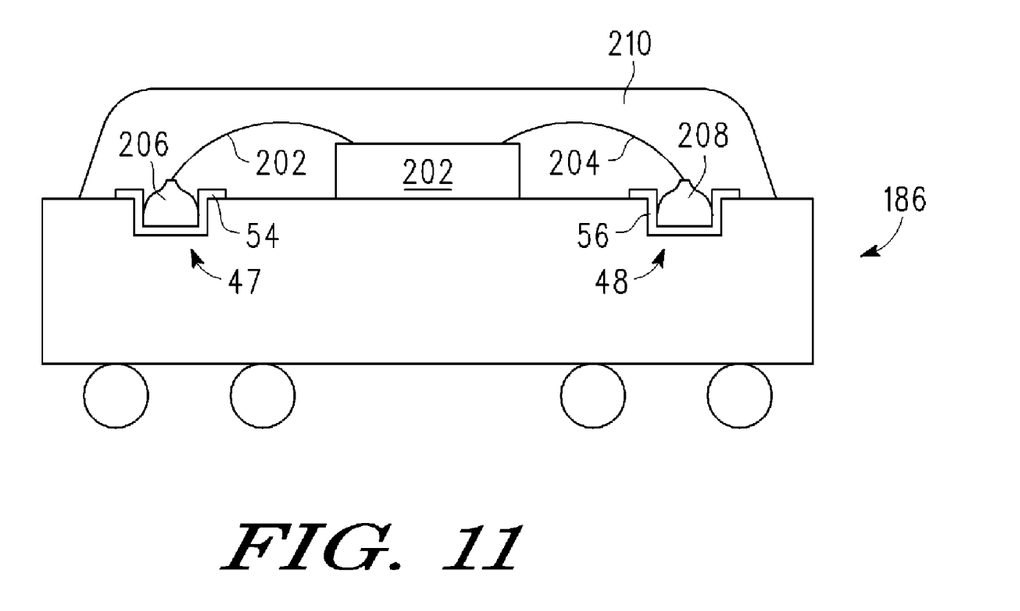
FIG. 11 depicts a fourth multiple packaged integrated circuit arrangement using a packaged integrated circuit similar to that of the packaged integrated circuit of FIG. 6

Shown in FIG. 11 is packaged integrated circuit 186 made the same as packaged integrated circuit with a different conductive fill structure and an overlying integrated circuit 202. Packaged integrated circuit 186 has a conductive fill 206 on conductive liner 54 and in groove 47 and a conductive fill 208 on conductive liner 56 and in groove 48. Conductive fills 206 and 208 are formed by a gold ball bond which is a type of wire bond. A gold wire 202 then extends to an active terminal of integrated circuit 202 from conductive fill 206. Similarly, a gold wire 204 extends from conductive fill 208 to an active terminal of integrated circuit 202. An encapsulant 210 is then formed over packaged integrated circuit 186 sufficient to cover integrated circuit 202 and gold wires 202 and 204.

Thus described is a structure including an integrated circuit. The structure comprises an integrated circuit die, a support structure, a plurality of bond wires, an encapsulant, a first conductive structure, and a second conductive structure. The integrated circuit die includes a plurality of bond pads located at a first surface of the integrated circuit die. Each of the plurality of bond wires is electrically connected to a bond pad of the plurality of bond pads and a conductive structure of the support structure. The encapsulant encapsulates at least the first surface of the integrated circuit die and the plurality of bond wires, the encapsulant having a first surface generally parallel to the first surface of the integrated circuit die and generally facing away from the first surface of the integrated circuit die, wherein the encapsulant includes a first open location in the first surface, a first bond wire of the plurality of bond wires is exposed from the encapsulant at the first open location, the encapsulant includes a second open location in the first surface, a second bond wire of the plurality of bond wires is exposed from the encapsulant at the second open location. The first conductive structure is located at the first open location and electrically connected to the first bond wire. The second conductive structure is located at the second open location and electrically connected the second bond wire. The first bond wire is electrically connected to a first bond pad of the plurality of bond pads of the integrated circuit die and a first conductive surface of the support structure and the second bond wire is electrically connected to a second bond pad of the plurality of bond pads of the integrated circuit die and a second conductive surface of the support structure. The structure may be further characterized by the first bond wire being at least partially severed at the first open location such that the first bond wire has a first cut surface located at one surface of the first open location and a second cut surface located at a second surface of the first open location, wherein the first conductive structure is electrically connected to the first cut surface of the first bond wire and the second cut surface of the first bond wire, and the second bond wire being at least partially severed at the second open location such that the second bond wire has a first cut surface located at one surface of the second open location and a second cut surface located at a second surface of the second open location, wherein the second conductive structure is electrically connected to the first cut surface of the second bond wire and the second cut surface of the second bond wire. The structure may further comprise a second integrated circuit die located outside of the encapsulant, the second integrated circuit die including a first bond pad electrically coupled to the first bond wire via the first conductive structure, the second integrated circuit die including a second bond pad electrically coupled to the second bond wire via the second conductive structure. The structure may be further characterized by the second integrated circuit die being implemented in an integrated circuit package, the integrated circuit package located adjacent to the first surface of the encapsulant. The structure may be further characterized by the second integrated circuit die having a first major surface and a second major surface opposite the first major surface, wherein the first major surface of the second integrated circuit die is substantially parallel to the first surface of the encapsulant. The structure may further comprise a plurality of external electrical connectors located at a first major side of the support structure, the integrated circuit die is located at a second major side of the support structure opposite the first major side, wherein a first external electrical connector of the plurality of electrical connectors is electrically coupled to the first bond wire and a second external electrical connector of the plurality of electrical connectors is electrically coupled to the second bond wire. The structure may be further characterized by the first external electrical connector being electrically coupled to the first conductive structure and the second external electrical connector being electrically coupled to the second conductive structure. The structure may be further characterized by the first open location and the second open location being part of a groove formed in the first surface of the encapsulant. The structure may be further characterized by the first bond pad being configured to convey a signal.

Also described is a structure including an integrated circuit. The structure comprises a first integrated circuit die, a support structure, a plurality of bond wires, an encapsulant, a first conductive structure located at the first open location and electrically connected to the first bond wire, and a second integrated circuit die. The first integrated circuit die includes a plurality of bond pads located at a first surface of the integrated circuit die. Each of the plurality of bond wires is electrically connected to a bond pad of the plurality of bond pads and a conductive structure of the support structure. The encapsulant encapsulates at least the first surface of the first integrated circuit die and the plurality of bond wires, the encapsulant having a first surface generally parallel to the first surface of the first integrated circuit die and generally facing away from the first surface of the first integrated circuit die, wherein the encapsulant includes a first open location in the first surface, a first bond wire of the plurality of bond wires is exposed from the encapsulant at the first open location. The second integrated circuit die is located outside of the encapsulant. The second integrated circuit die includes a conductive structure electrically coupled to the first bond wire via the first conductive structure. The structure may be further characterized by the second integrated circuit die being implemented in an integrated circuit package and the integrated circuit package being located adjacent to the first surface of the encapsulant. The structure may be further characterized by the encapsulant including a second open location in the first surface and a second bond wire of the plurality of bond wires being exposed from the encapsulant at the second open location, wherein the structure further comprises a second conductive structure located at the second open location and electrically connected to the second bond wire and a third integrated circuit die, the third integrated circuit die located outside the encapsulant, the third integrated circuit die including a conductive structure electrically coupled to the second bond wire via the second conductive structure. The structure may be further characterized by the second integrated circuit die being implemented in a first integrated circuit package and the third integrated circuit die being implemented in a second integrated circuit package. The structure may further comprise a second bond wire electrically coupled to the conductive structure of the second integrated circuit die and wire bonded to the first conductive structure. The structure may further comprise a plurality of external electrical connectors located at a first major side of the support structure, the integrated circuit die is located at a second major side of the support structure opposite the first major side, wherein a first external electrical connector of the plurality of external electrical connectors is electrically coupled to the first bond wire, the first external electrical connector is electrically coupled to the conductive structure of the second integrated circuit via the first conductive structure.

Also described is a method of forming an integrated circuit package. The method comprises attaching a first integrated circuit die to a support structure and a second integrated circuit die to the support structure, bonding a first plurality of bond wires to a first plurality of bond pads located at a first side of the integrated circuit die and to a first plurality of conductive surfaces of the support structure, bonding a second plurality of bond wires to a second plurality of bond pads located at a first side of the second integrated circuit die and to a second plurality of conductive surfaces of the support structure, encapsulating with an encapsulant, exposing a first bond wire and a second bond wire of the first plurality of bond wires by removing material of the encapsulant from a first surface of the encapsulant, exposing a third bond wire and a fourth bond wire of the second plurality of bond wires by removing material of the encapsulant from a first surface of the encapsulant, forming a first conductive structure electrically connected to the first bond wire and a second conductive structure electrically connected to second bond wire, forming a third conductive structure electrically connected to the third bond wire and a fourth conductive structure electrically connected to fourth bond wire, and singulating the encapsulant and the support structure into a plurality of integrated circuit packages after the forming the first conductive structure, the second conductive structure, the third conductive structure, and the fourth conductive structure. The step of encapsulating is further characterized by encapsulating with an encapsulant at least the first side of the first integrated circuit die, at least the first side of the second integrated circuit die, the first plurality of bond wires, and the second plurality of bond wires. The step of exposing the first and second wire bonds is further characterized by the first surface of the encapsulant being generally parallel to the first surface of the integrated circuit die and the first surface of the second integrated circuit die, wherein the first bond wire is electrically connected to a first bond pad of the first plurality of bond pads and a first conductive surface of the first plurality of conductive surfaces, wherein the second bond wire is electrically connected to a second bond pad of the first plurality of bond pads and a second conductive surface of the first plurality of conductive surfaces. The step of exposing the third and fourth bond wires is further characterized by the third bond wire being electrically connected to a third bond pad of the second plurality of bond pads and a third conductive surface of the second plurality of conductive surfaces, wherein the fourth bond wire is electrically connected to a fourth bond pad of the second plurality of bond pads and a fourth conductive surface of the second plurality of conductive surfaces. The step of forming the first and second conductive structure is further characterized by the first conductive structure being located at a first location of the encapsulant where encapsulant material was removed from the first surface and the second conductive structure being located at a second location of the encapsulant where encapsulant material was removed from the first surface. The step of forming the third and fourth conductive structures is further characterized by the third conductive structure being located at a third location of the encapsulant where encapsulant material was removed from the first surface and the fourth conductive structure being located at fourth location of the encapsulant where encapsulant material was removed from the first surface. The step of singulating is further characterized by a first integrated circuit package of the plurality of integrated circuit packages including the first integrated circuit die, the first wire bond, the second wire bond, the first conductive structure, and the second conductive structure and not including any of the third conductive structure and the fourth conductive structure, wherein the second integrated circuit package includes the second integrated circuit die, the third wire bond, the fourth wire bond, the third conductive structure, and the fourth conductive structure and does not include any of the first conductive structure and the second conductive structure. The method may be further characterized by the exposing the first wire bond and the second wire bond and the exposing the third wire bond and the fourth wire bond include forming a groove in the first surface of the encapsulant. The method may be further characterized by the first integrated circuit die and the second integrated circuit die being attached to a first side of the support structure, and the method may further comprise forming a plurality of external electrical connectors at a second side of the support structure, wherein a first external electrical connector of the plurality is electrically coupled to the first conductive structure via the first bond wire, a second external electrical connector of the plurality is electrically coupled to the second conductive structure via the second bond wire, a third external electrical connector of the plurality is electrically coupled to the third conductive structure via the third bond wire, and a fourth external electrical connector of the plurality is electrically coupled to the fourth conductive structure via the fourth bond wire, wherein the first integrated circuit package includes the first external electrical connector and the second external electrical connector and the second integrated circuit package includes the third external electrical connector and the fourth external electrical connector. The method may further comprise electrically coupling a first bond pad of a third integrated circuit die to the first wire bond via the first conductive structure and electrically coupling a second bond pad of the third integrated circuit die to the second bond wire via the second conductive structure. The method may be further characterized by the electrically coupling the first bond pad of the third integrated circuit die and the electrically coupling the second bond pad of the third integrated circuit die occurring after the singulating. The method may further comprise forming a third integrated circuit package including the third integrated circuit die and attaching the third integrated circuit package to the first integrated circuit package.

Although the invention is described herein with reference to specific embodiments, various modifications and changes can be made without departing from the scope of the present invention as set forth in the claims below. For example, there may other types of conductive fill than those described. Further, the grooves may have lengths, cross-sectional shapes, and width-to-depth aspect ratios different than those described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A structure including an integrated circuit, the structure comprising:
    an integrated circuit die, the integrated circuit die including a plurality of bond pads located at a first surface of the integrated circuit die;
    a support structure;
    a plurality of bond wires, each of the plurality of bond wires electrically connected to a bond pad of the plurality of bond pads and a conductive structure of the support structure;
    an encapsulant, the encapsulant encapsulating at least the first surface of the integrated circuit die and the plurality of bond wires, the encapsulant having a first surface generally parallel to the first surface of the integrated circuit die and generally facing away from the first surface of the integrated circuit die, wherein the encapsulant includes a first open location in the first surface, a first bond wire of the plurality of bond wires is exposed from the encapsulant at the first open location, the encapsulant includes a second open location in the first surface, a second bond wire of the plurality of bond wires is exposed from the encapsulant at the second open location;
    a first conductive structure located at the first open location and electrically connected to the first bond wire; and
    a second conductive structure located at the second open location and electrically connected the second bond wire;
    wherein the first bond wire is electrically connected to a first bond pad of the plurality of bond pads of the integrated circuit die and a first conductive surface of the support structure and the second bond wire is electrically connected to a second bond pad of the plurality of bond pads of the integrated circuit die and a second conductive surface of the support structure.

2. The structure of claim 1 wherein:
    the first bond wire is at least partially severed at the first open location such that the first bond wire has a first cut surface located at one surface of the first open location and a second cut surface located at a second surface of the first open location, wherein the first conductive structure is electrically connected to the first cut surface of the first bond wire and the second cut surface of the first bond wire; and
    the second bond wire is at least partially severed at the second open location such that the second bond wire has a first cut surface located at one surface of the second open location and a second cut surface located at a second surface of the second open location, wherein the second conductive structure is electrically connected to the first cut surface of the second bond wire and the second cut surface of the second bond wire.

3. The structure of claim 1 further comprising:
    a second integrated circuit die located outside of the encapsulant, the second integrated circuit die including a first bond pad electrically coupled to the first bond wire via the first conductive structure, the second integrated circuit die including a second bond pad electrically coupled to the second bond wire via the second conductive structure.

4. The structure of claim 3 wherein the second integrated circuit die is implemented in an integrated circuit package, the integrated circuit package located adjacent to the first surface of the encapsulant.

5. The structure of claim 3 wherein the second integrated circuit die has a first major surface and a second major surface opposite the first major surface, wherein the first major surface of the second integrated circuit die is substantially parallel to the first surface of the encapsulant.

6. The structure of claim 1 further comprising:
    a plurality of external electrical connectors located at a first major side of the support structure, the integrated circuit die is located at a second major side of the support structure opposite the first major side, wherein a first external electrical connector of the plurality of external electrical connectors is electrically coupled to the first bond wire and a second external electrical connector of the plurality of external electrical connectors is electrically coupled to the second bond wire.

7. The structure of claim 6 wherein the first external electrical connector is electrically coupled to the first conductive structure and the second external electrical connector is electrically coupled to the second conductive structure.

8. The structure of claim 1 wherein the first open location and the second open location are part of a groove formed in the first surface of the encapsulant.

9. The structure of claim 1 wherein the first bond pad is configured to convey a signal.

10. A structure including an integrated circuit, the structure comprising:

a first integrated circuit die, the first integrated circuit die including a plurality of bond pads located at a first surface of the first integrated circuit die;

a support structure;

a plurality of bond wires, each of the plurality of bond wires electrically connected to a bond pad of the plurality of bond pads and a conductive structure of the support structure;

an encapsulant, the encapsulant encapsulating at least the first surface of the first integrated circuit die and the plurality of bond wires, the encapsulant having a first surface generally parallel to the first surface of the first integrated circuit die and generally facing away from the first surface of the first integrated circuit die, wherein the encapsulant includes a first open location in the first surface, a first bond wire of the plurality of bond wires is exposed from the encapsulant at the first open location;

a first conductive structure located at the first open location and electrically connected to the first bond wire; and a second integrated circuit die, the second integrated circuit die located outside of the encapsulant, the second integrated circuit die including a conductive structure electrically coupled to the first bond wire via the first conductive structure.

11. The structure of claim 10 wherein the second integrated circuit die is implemented in an integrated circuit package, the integrated circuit package located adjacent to the first surface of the encapsulant.

12. The structure of claim 10 wherein the encapsulant includes a second open location in the first surface, a second bond wire of the plurality of bond wires is exposed from the encapsulant at the second open location, the structure further comprising:

a second conductive structure located at the second open location and electrically connected to the second bond wire;

a third integrated circuit die, the third integrated circuit die located outside the encapsulant, the third integrated circuit die including a conductive structure electrically coupled to the second bond wire via the second conductive structure.

13. The structure of claim 12 wherein the second integrated circuit die is implemented in a first integrated circuit package and the third integrated circuit die is implemented in a second integrated circuit package.

14. The structure of claim 10 further comprising:

a second bond wire electrically coupled to the conductive structure of the second integrated circuit die and wire bonded to the first conductive structure.

15. The structure of claim 10 further comprising:

a plurality of external electrical connectors located at a first major side of the support structure, the integrated circuit die is located at a second major side of the support structure opposite the first major side, wherein a first external electrical connector of the plurality of external electrical connectors is electrically coupled to the first bond wire, the first external electrical connector is electrically coupled to the conductive structure of the second integrated circuit via the first conductive structure.

* * * * *